United States Patent
Jiang et al.

(10) Patent No.: US 7,850,871 B2
(45) Date of Patent: Dec. 14, 2010

(54) RESISTIVITY STABLE ELECTRICALLY CONDUCTIVE FILMS FORMED FROM POLYTHIOPHENES

(75) Inventors: Xuezhong Jiang, Fogelsville, PA (US); Andrew Francis Nordquist, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 585 days.

(21) Appl. No.: 11/760,000

(22) Filed: Jun. 8, 2007

(65) Prior Publication Data

US 2010/0019228 A1    Jan. 28, 2010

Related U.S. Application Data

(63) Continuation-in-part of application No. 11/240,573, filed on Oct. 3, 2005, now Pat. No. 7,569,158.

(60) Provisional application No. 60/618,471, filed on Oct. 13, 2004, provisional application No. 60/665,026, filed on Mar. 24, 2005.

(51) Int. Cl.
  *H01B 1/12* (2006.01)
  *B05D 5/12* (2006.01)
(52) U.S. Cl. .................. 252/500; 427/377
(58) Field of Classification Search ............ 252/500; 528/226, 377; 549/50; 427/58, 96, 377
See application file for complete search history.

(56) References Cited

U.S. PATENT DOCUMENTS

| | | | |
|---|---|---|---|
| 3,282,875 A | 11/1966 | Connolly et al. | |
| 4,358,545 A | 11/1982 | Ezzell et al. | |
| 4,433,082 A | 2/1984 | Grot | |
| 4,940,525 A | 7/1990 | Ezzell et al. | |
| 5,300,575 A | 4/1994 | Jonas et al. | |
| 5,422,411 A | 6/1995 | Wei et al. | |
| 5,442,411 A | 8/1995 | Urbanus et al. | |
| 6,087,196 A | 7/2000 | Sturm et al. | |
| 6,150,426 A | 11/2000 | Curtin et al. | |
| 6,586,764 B2 | 7/2003 | Buechel et al. | |
| 7,060,846 B2 * | 6/2006 | Zahn et al. | 549/78 |
| 7,071,289 B2 * | 7/2006 | Sotzing | 528/377 |

(Continued)

FOREIGN PATENT DOCUMENTS

EP    1559739    3/2005

(Continued)

OTHER PUBLICATIONS

Pomerantz et al; "Poly(2-decylthienol(3,4-b)thiophene-4,6-diyl). A New Low Bank Gap Conducting Polymer;" Macromolecules (2001), 34 p. 1817-1822.

(Continued)

*Primary Examiner*—Mark Kopec
(74) *Attorney, Agent, or Firm*—Michael K. Boyer

(57) ABSTRACT

A resistivity stable aqueous dispersion and a method for making an aqueous dispersion. The dispersion including polythienothiophene and at least one colloid-forming polymeric acid having a pH of from about 3 to about 10. The method includes preparing an aqueous dispersion containing polythienothiophene and adjusting the pH of the dispersion to a sufficiently high pH to provide resistivity stability. Devices utilizing layers formed of pH adjusted polythienothiophene are also disclosed.

11 Claims, 2 Drawing Sheets

U.S. PATENT DOCUMENTS

| | | | |
|---|---|---|---|
| 7,118,692 B2 * | 10/2006 | Nordquist et al. | 252/500 |
| 7,241,904 B2 * | 7/2007 | Zahn et al. | 549/80 |
| 7,432,340 B2 * | 10/2008 | Zahn et al. | 528/377 |
| 7,572,879 B2 * | 8/2009 | Zahn et al. | 528/377 |
| 2004/0010115 A1 * | 1/2004 | Sotzing | 528/377 |
| 2004/0074779 A1 | 4/2004 | Sotzing | |
| 2004/0102577 A1 * | 5/2004 | Hsu et al. | 525/182 |
| 2004/0121210 A1 | 6/2004 | Hamrock et al. | |
| 2005/0037265 A1 | 2/2005 | Watakabe | |
| 2005/0151122 A1 | 7/2005 | Jiang et al. | |
| 2006/0076557 A1 | 4/2006 | Waller et al. | |
| 2006/0231828 A1 | 10/2006 | De Kok-Van Breemen et al. | |
| 2008/0121846 A1 | 5/2008 | Hsu et al. | |

FOREIGN PATENT DOCUMENTS

| | | |
|---|---|---|
| EP | 1026152 | 7/2006 |
| JP | 07-188399 A | 7/1995 |
| JP | 2006-500463 A | 1/2006 |
| WO | 03/006537 | 1/2003 |
| WO | 2004/029128 A2 | 4/2004 |

OTHER PUBLICATIONS

Hong et al; "Understanding the Conformational Stability and Electronic Structures of Modified Polymers Based on Polythiophene;" Macromolecules (1992); 25; p. 46552-4657.

Neugebauer, H.; "Infrared signatures of positive and negative charge carriers in conjugated polymers with low band gaps;" Journal of Electroanalytical Chemistry (2004), 563, p. 153-159.

Wu, Theiss, Gu, Lu, Sturm, Wagner and Forrest; "Integration of Organic LED's and Amorphous Si TFT's onto Flexible and Lightweight Metal Foil Substrates;" IEEEE Electron Device Letters, vol. 18, No. 12, Dec. 1997.

Fyfe, David; Advances in P-OLED Technology, Overcoming the Hurdles Fast presented at Cambridge Display Technology; Nov. 15, 2004.

Wenchen Su, Dmitry Poplavskyy, Franky So, Howard Clearfield, Dean Welsh and Weishi Wu; "Trilayer Polymer OLED Devices for Passive Matrix Applications;" SID 2005 Digest; ISSN/005-966X/05/3602; p. 1871-1873.

Weijtens, et al; "Effect of the alkali metal content on the electronic properties of PEDOT:PSS," Organic Electronics; 2005 pp. 1-8 .

Kok, et al; "Modification of PEDOT: PSS as hole injection layer in polymer LEDs," Phys. Stat. Sol. (a) 201, No. 6. (2004); pp=1342-1359.

U.S. Appl. No. 60/665,026, filed Mar. 24, 2005, Waller.

U.S. Appl. No. 60/618,471, filed Oct. 13, 2004, Waller.

Sotzing et al; "Intrinsically Conducting Polymers and Green Chemistry," Polymer Preprints 2002, 43(2), 904-905.

Lee et al; "Aqueous Phase Polymerization of thieno(3-4-b)thiophene;" Polymer Preprints 2002, 43(2) 568-569.

* cited by examiner

RESISTIVITY STABLE ELECTRICALLY CONDUCTIVE FILMS FORMED FROM POLYTHIOPHENES

RELATED APPLICATIONS

This application is a continuation-in-part of U.S. patent application Ser. No. 11/240,573, filed Oct. 3, 2005. U.S. application Ser. No. 11/240,573 claimed the benefit of U.S. Provisional Application No. 60/618,471, filed on Oct. 13, 2004 and Application Ser. No. 60/665,026, filed on Mar. 24, 2005. The disclosure of the previously identified patent applications is hereby incorporated by reference in their entirety.

BACKGROUND OF THE INVENTION

The present invention relates to producing electrically conductive films cast from pH adjusted aqueous dispersions comprising electrically conducting polymers. In particular, the present invention is directed to resistivity stable films of thienothiophene polymers synthesized in the presence of at least on colloid forming polymeric acid.

Electrically conducting polymers have been used in a variety of organic electronic devices, including in the development of electroluminescent (EL) devices for use in light emissive displays. With respect to EL devices, such as organic light emitting diodes (OLEDs) containing conducting polymers, such devices generally have the following configuration:

anode/hole injection layer/EL layer/cathode

The anode is typically any material that has the ability to inject holes into the otherwise filled π-band of the semiconducting material used in the EL layer, such as, for example, indium/tin oxide (ITO). The anode is optionally supported on a glass or plastic substrate. The EL layer is typically semi-conducting, conjugated organic material, including a conjugated semiconducting polymer such as poly(paraphenylenevinylene), polyfluorene, spiropolyfluorene or other EL polymer material, a small molecule fluorescent dye such as 8-hydroxquinoline aluminum ($Alq_3$), a small molecule phosphorescent dye such as fac tris(2-phenylpyridine) Iridium (III), a dendrimer, a conjugated polymer grafted with phosphorescent dye, a blend that contains the above-mentioned materials, and combinations. The EL layer can also be inorganic quantum dots or blends of semiconducting organic material with inorganic quantum dots. The cathode is typically any material (such as, e.g., Ca or Ba) that has the ability to inject electrons into the otherwise empty π*-band of the semiconducting organic material in the EL layer.

The hole injection layer (HIL) is typically a conducting polymer and facilitates the injection of holes from the anode into the semiconducting organic material in the EL layer. The hole injection layer can also be called a hole transport layer, hole injection/transport layer, or anode buffer layer, or may be characterized as part of a bilayer anode. Typical conducting polymers employed as hole injection layer include polyaniline and polydioxythiophenes such as poly(3,4-ethylenedioxythiophene) (PEDOT). These materials can be prepared by polymerizing aniline or dioxythiophene monomers in aqueous solution in the presence of a water soluble polymeric acid, such as poly(styrenesulfonic acid) (PSSA), as described in, for example, U.S. Pat. No. 5,300,575 entitled "Polythiophene dispersions, their production and their use"; hereby incorporated by reference in its entirety. A well known PEDOT/PSSA material is Baytron®-P, commercially available from H. C. Starck, GmbH (Leverkusen, Germany).

Electrically conducting polymers have also been used in photovoltaic devices, which convert radiation energy into electrical energy. Such devices generally have the following configuration:

positive electrode/hole extraction layer/light harvesting layer(s)/negative electrode The positive electrode and negative electrode can be selected from materials used for the anode and cathode of EL devices mentioned above. The hole extraction layer is typically a conducting polymer that facilitates the extraction of holes from the light harvesting layers for collection at the positive electrode. The light harvesting layer or layers typically consists of organic or inorganic semiconductors that can absorb light radiation and generate separated charges at an interface.

Aqueous electrically conductive polymer dispersions synthesized with water soluble polymeric sulfonic acids have undesirable low pH levels. The low pH can contribute to decreased stress life of an EL device containing such a hole injection layer, and contribute to corrosion within the device. Accordingly, there is a need in this art for compositions and hole injection layer prepared therefrom having improved properties.

Electrically conducting polymers also have utility as electrodes for electronic devices, such as thin film field effect transistors. In such transistors, an organic semiconducting film is present between source and drain electrodes. To be useful for the electrode application, the conducting polymers and the liquids for dispersing or dissolving the conducting polymers have to be compatible with the semiconducting polymers and the solvents for the semiconducting polymers to avoid re-dissolution of either conducting polymers or semi-conducting polymers. The electrical conductivity of the electrodes fabricated from the conducting polymers should be greater than 10 S/cm (where S is a reciprocal ohm). However, the electrically conducting polythiophenes made with a polymeric acid typically provide conductivity in the range of about $10^{-3}$ S/cm or lower. In order to enhance conductivity, conductive additives may be added to the polymer. However, the presence of such additives can deleteriously affect the processability of the electrically conducting polythiophene. Accordingly, there is a need in this art for improved conducting polymers with good processability and increased conductivity.

Due to the limited lifetime of double or bilayer devices, more complicated device structures have been introduced to improve the device performance, especially lifetime. For example, a thin layer of a hole transporting and electron blocking material, which is known as an "interlayer", has been shown to be effective in improving device performance and lifetime. Cambridge Display Technology reported enhanced lifetime with interlayer at OLEDs 2004 conference [David Fyfe, "Advances in P-OLED Technology—Overcoming the Hurdles Fast", OLEDs 2004, San Diego, Calif. from Nov. 15 to 17, 2004; hereby incorporated by reference in its entirety]. So et al. reported 2× enhancement in efficiency and 7× enhancement in lifetime by inserting a crosslinkable hole transporting layer (XL-HTL) between the PEDOT:PSSA hole injection layer and a green polyfluorene light emitting layer. [Wencheng Su, Dmitry Poplavskyy, Franky So, Howard Clearfield, Dean Welsh, and Weishi Wu, "Trilayer Polymer OLED Devices for Passive Matrix Applications", SID 05 Digest, Page 1871-1873; hereby incorporated by reference in its entirety].

Although these trilayer devices provide improved device performance and lifetime, the additional interlayer increases TACT time and/or manufacturing capital cost, and might decrease device yields. There is a need in this art for a double layer device with improved device performance and lifetime.

In our pending patent applications (U.S. patent application Ser. No. 11/240,573), we found that the lifetime performance of OLEDs can be improved significantly using conductive polymers based on PTT and fluorinated polymeric acid as the hole injection layer. We also found that the conductivity (resistivity) of films cast from aqueous dispersions of conductive polymers based on PTT and fluorinated polymeric acid changes significantly upon annealing at elevated temperatures. This is advantageous if the targeted application can accept the conductivity change. However, in some applications, the resistivity change is not ideal. In the latter case, there is a need to suppress the resistivity change during the process, especially during annealing or baking of devices after different layers, such as the hole injection layer and the light emitting layer, have been coated.

Therefore what is needed is a process for fabrication of electrically conductive polymers and electrically conductive polymers produced having controlled electrical resistivity.

BRIEF SUMMARY OF THE INVENTION

The present invention solves problems associated with the change of conductivity (or resistivity) of films prepared from aqueous dispersions comprising polythienothiophenes (PTT) and at least one colloid-forming fluorinated polymeric acid, that occur during annealing of the films at elevated temperatures. The inventive compositions are useful as hole injection layer in a variety of organic electronic devices, such as for example, organic light emitting diodes (OLEDs), as hole extraction layer in a variety of organic optoelectronic devices, such as for example, organic photovoltaic devices (OPVDs), and as the charge injection layer between the source/drain electrodes and the semiconductive channel material, among other applications.

In accordance with one embodiment, the present invention relates to organic electronic devices, including electroluminescent devices, comprising hole injection layer of the inventive compositions. The layers formed with the polythienothiophene dispersion according to embodiments of the present invention include resistivity stability. In addition, the present invention permits fabricating bi-layered devices having acceptable lifetime performance. By "lifetime" it is meant the length of time taken for an initial brightness of a continuously operating device (e.g., a PLED) to decrease to a ratio of the initial brightness that is acceptable for the targeted application (e.g., 50% of the initial brightness).

In accordance with another embodiment, the present invention relates to a method for synthesizing aqueous dispersions comprising polythienothiophenes and at least one colloid-forming polymeric acid. The dispersions include a pH of from about 3 to about 10. A method for producing a pH adjusted aqueous dispersion of polythienothiophene and at least one colloid-forming polymeric acid, includes the following:

(a) providing an aqueous solution comprising at least one oxidant and/or at least one catalyst;
(b) providing an aqueous dispersion comprising the colloid-forming polymeric acid;
(c) combining the aqueous solution of the oxidant and/or catalyst with the aqueous dispersion of the colloid-forming polymeric acid,
(d) adding thienothiophene monomer to the combined aqueous dispersion of step (c);
(e) polymerizating the thienothiophene monomer containing dispersion to form a polymeric dispersion; and (f) adjusting the pH of the polymer dispersion to a pH sufficiently high to provide resistivity stability.

The inventive polythienothiophene dispersions can be applied onto any suitable substrate, and dried. If desired, the polythienothiophene coated substrate can be heated under conditions sufficient to impart a desired conductivity, device performance and lifetime performance.

DETAILED DESCRIPTION OF THE INVENTION

Figure 1:
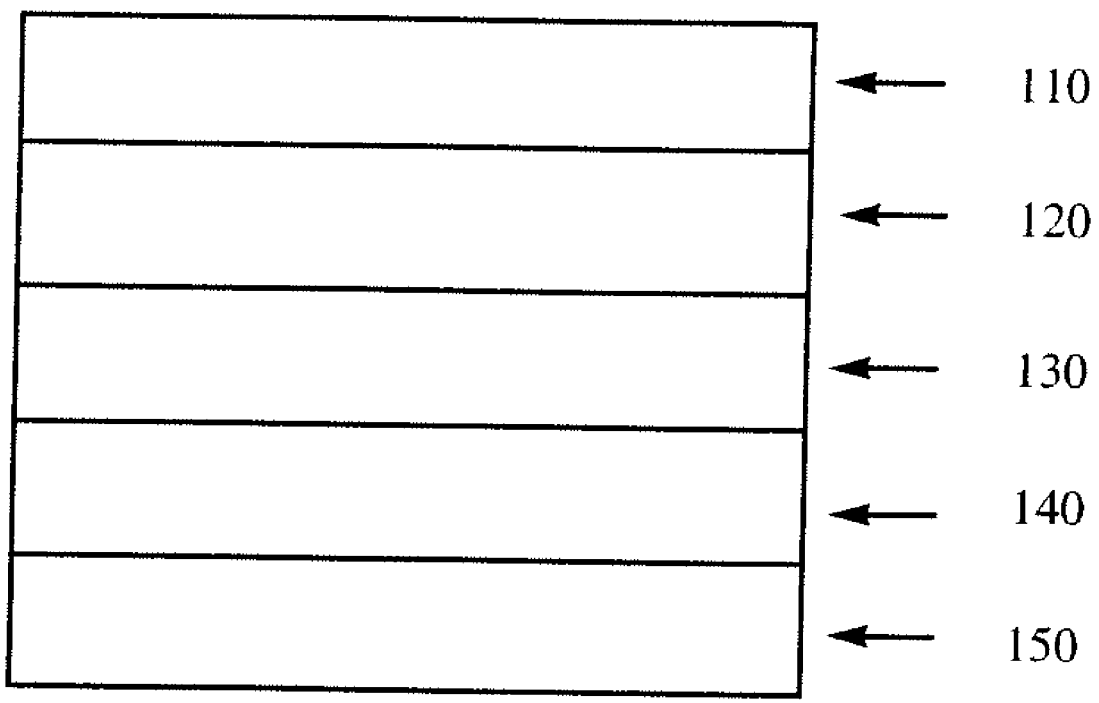
FIG. 1 illustrates an elevational cross-sectional view of an electronic device that includes a hole injection layer according to an embodiment of the present invention.

The present invention relates to aqueous dispersions with increased pH values that comprise polythienothiophenes, methods for making and applying such dispersions, and devices incorporating polythienothiophene containing films. The inventive dispersions may comprise polythienothiophenes, including, poly(thieno[3,4-b]thiophenes), and colloid-forming polymeric acids (e.g., at least partially fluorinated ion exchange polymers). As used herein, the term "dispersion" refers to a liquid medium comprising a suspension of minute colloid particles. In accordance with the invention, the "liquid medium" is typically an aqueous liquid, e.g., de-ionized water. As used herein, the term "aqueous" refers to a liquid that has a significant portion of water and in one embodiment it is at least about 40% by weight water. As used herein, the term "colloid" refers to the minute particles suspended in the liquid medium, said particles having a particle size up to about 1 micron (e.g., about 20 nanometers to about 800 nanometers and normally about 30 to about 500 nanometers). As used herein, the term "colloid-forming" refers to substances that form minute particles when dispersed in aqueous solution, i.e., "colloid-forming" polymeric acids are not water-soluble.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

In one aspect of the invention, pH adjusted aqueous dispersions comprising electrically conductive polythienothiophenes such as poly(thieno[3,4-b]thiophene) can be prepared when thienothiophene monomers including thieno[3,4-b]thiophene monomers, are polymerized chemically in the presence of at least one colloid-forming polymeric acid. The dispersion of polythienothiophene including a pH adjustment include resistivity stability. "Resistivity stability" or "conductivity stability" and variations thereof include a material property wherein change in resistivity and/or conductivity, such as change resistivity/conductivity resulting from annealing, further polymerization and/or any other physical or chemical mechanisms, is reduced or eliminated. While not so limited, resistivity stability may include changes in resistivity (i.e., a resistivity change ratio) after an annealing in less than about 100:1 ratio (unannealed ohm-cm: annealed ohm-cm) in resistivity or less than about 10:1 change in resistivity, as measured in ohms-cm. "Annealing", "Annealed" and variations thereof include heating of a solid material at a sufficient temperature for a sufficient time, where a portion or most of solvent and/or water therein volatilizes.

The use of a polymeric acid that is not water soluble in preparation of an aqueous dispersion of the polythienothiophenes or poly(thieno[3,4-b]thiophenes) can yield a composition with superior electrical properties (e.g., conductivity of about $10^{-2}$ to about $10^{-7}$ S/cm). The pH adjusted dispersion according to an embodiment of the present invention includes a pH value of from about 3 to about 10, or about 3 to about 6 when adjusted via contact with an ion exchange resin or from about 3 to about 8 or greater than about 8 to about 10 when adjusted by titration. One advantage of these aqueous dispersions is that the electrically conductive particles are normally stable in the aqueous medium (e.g., without forming a separate phase) over a relatively long period of time (e.g., the dispersions are stable for about 14 to about 180 days). Moreover, the conductive particles generally do not re-disperse once dried into films.

Compositions according to one embodiment of the invention comprise a continuous aqueous phase in which the poly(thieno[3,4-b]thiophene) and colloid-forming polymeric acid are dispersed. Poly(thieno[3,4-b]thiophenes) that can be used in the present invention can have the structure (1) and (2):

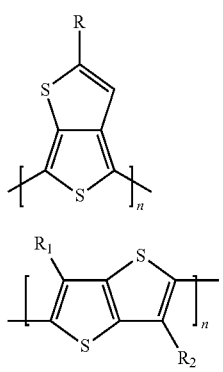

wherein R is selected from hydrogen, an alkyl having 1 to 8 carbon atoms, phenyl, substituted phenyl, $C_mF_{2m+1}$, F, Cl, and $SF_5$, and n is greater than about 2 and less than 20 and normally about 4 to about 16. Thienothiophenes that can be used in the compositions of this invention may also have the structure (2) as provided above, wherein $R_1$ and $R_2$ are independently selected from the list above. In one particular embodiment, the polythienothiophene comprises poly(thieno[3,4-b]thiophene) wherein R comprises hydrogen.

The compositions of the present invention are not limited to the homopolymeric structures above and may include heteropolymeric or copolymeric structures. The copolymeric structures may be any combination of alternating copolymers (e.g., alternating A and B units), periodic copolymers (e.g., (A-B-A-B-B-A-A-A-A-B-B-B)n, random copolymers (e.g., random sequences of monomer A and B), statistical copolymers (e.g., polymer sequence obeying statistical rules) and/or block copolymers (e.g., two or more homopolymer subunits linked by covalent bonds). The copolymers may be branched or linked, provided the resultant copolymer maintains the properties of electrical conductivity.

Colloid-forming polymeric acids contemplated for use in the practice of the invention are insoluble in water, and form colloids when dispersed into a suitable aqueous medium. The polymeric acids typically have a molecular weight in the range of about 10,000 to about 4,000,000. In one embodiment, the polymeric acids have a molecular weight of about 50,000 to about 2,000,000. Any polymeric acid that is colloid-forming when dispersed in water is suitable for use in the practice of the invention. In one embodiment, the colloid-forming polymeric acid comprises polymeric sulfonic acid. Other acceptable polymeric acids comprise at least one member of polymer phosphoric acids, polymer carboxylic acids, and polymeric acrylic acids, and mixtures thereof, including mixtures having polymeric sulfonic acids. In another embodiment, the polymeric sulfonic acid comprises a fluorinated acid. In still another embodiment, the colloid-forming polymeric sulfonic acid comprises a perfluorinated compound. In yet another embodiment, the colloid-forming polymeric sulfonic acid comprises a perfluoroalkylenesulfonic acid.

In still another embodiment, the colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, and in one embodiment at least about 75%, and in another embodiment at least about 90%. In one embodiment, the polymer comprises at least one perfluorinated compound.

The polymeric acid can comprise sulfonate functional groups. The term "sulfonate functional group" refers to either sulfonic acid groups or salts of sulfonic acid groups, and in one embodiment comprises at least one of alkali metal or ammonium salts. The functional group is represented by the formula $-SO_3X$ where X comprises a cation, also known as a "counterion". X can comprise at least one member selected from the group consisting of H, Li, Na, K or $N(R_1)(R_2)(R_3)(R_4)$, and $R_1, R_2, R_3$, and $R_4$ are the same or different, and are in one embodiment H, $CH_3$ or $C_2H_5$. In another embodiment, X comprises H, in which case the polymer is said to be in the "acid form". X may also be multivalent, as represented by such ions as $Ca^{2+}$, $Al^{3+}$, $Fe^{2+}$ and $Fe^{3+}$. In the case of multivalent counterions, represented generally as $M^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying a cation exchange group or its precursor, e.g., a sulfonyl fluoride group ($-SO_2F$), which can be subsequently hydrolyzed to a sulfonate functional group. For example, copolymers comprising a first fluorinated vinyl monomer together with a second fluorinated vinyl monomer having a sulfonyl fluoride group ($-SO_2F$) can be used. Examples of suitable first monomers comprise at least one member from the group of tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a desirable first monomer.

In other embodiments, examples of second monomers comprise at least one fluorinated vinyl ether with sulfonate functional groups or precursor groups which can provide the desired side chain in the polymer. Additional monomers include ethylene. In one embodiment, FSA polymers for use in the present invention comprise at least one highly fluorinated FSA, and in one embodiment perfluorinated, carbon backbone and side chains represented by the formula

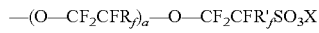

wherein $R_f$ and $R'_f$ are independently selected from F, Cl or a perfluorinated alkyl group having 1 to 10 carbon atoms, a=0, 1 or 2, and X comprises at least one of H, Li, Na, K or $N(R_1)(R_2)(R_3)(R_4)$ and $R_1$, $R_2$, $R_3$, and $R_4$ are the same or different and are and in one embodiment H, $CH_3$ or $C_2H_5$. In another embodiment X comprises H. As stated above, X may also be multivalent.

In another embodiment, the FSA polymers include, for example, polymers disclosed in U.S. Pat. Nos. 3,282,875, 4,358,545 and 4,940,525 (all hereby incorporated by reference in their entirety). An example of a useful FSA polymer comprises a perfluorocarbon backbone and the side chain represented by the formula

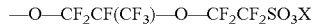

where X is as defined above. FSA polymers of this type are disclosed in U.S. Pat. No. 3,282,875 and can be made by copolymerization of tetrafluoroethylene (TFE) and the perfluorinated vinyl ether $CF_2$=$CF$—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3X$, wherein X is as defined above. This polymer can be made by copolymerization of tetrafluoroethylene (TFE) and the perfluorinated vinyl ether $CF_2$=$CF$—O—$CF_2CF_2SO_2F$, perfluoro(3-oxa-4-pentenesulfonyl fluoride) (POPF), followed by hydrolysis and further ion exchange as necessary.

In another embodiment, the FSA polymers include, for example, polymers disclosed in US 2004/0121210 A1; hereby incorporated by reference in its entirety. An example of a useful FSA polymer can be made by copolymerization of tetrafluoroethylene (TFE) and the perfluorinated vinyl ether $CF_2$=$CF$—O—$CF_2CF_2CF_2CF_2SO_2F$ followed by conversion to sulfonate groups by hydrolysis of the sulfonyl fluoride groups and ion exchanged as desired to convert the fluoride groups to the desired ionic form. In another embodiment, the FSA polymers include, for example, polymers disclosed in US2005/0037265 A1; hereby incorporated by reference in its entirety. An example of a useful FSA polymer can be made by copolymerization of $CF_2$=$CFCF_2OCF_2CF_2SO_2F$ and tetrafluoroethylene followed by conversion to sulfonate groups by KOH hydrolysis of the sulfonyl fluoride groups and ion exchanged with acid to convert the potassium ion salt to the acid form.

In other embodiments, the FSA polymers for use in this invention typically have an ion exchange ratio of less than about 33. "Ion exchange ratio" or "IXR" is meant as the number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain comprises —O—$CF_2$—$CF(CF_3)$—O—$CF_2$—$CF_2$—$SO_3H$ (or a salt thereof), the equivalent weight range which corresponds to an IXR of about 8 to about 23, is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525 (hereby incorporated by reference in their entirety), e.g., the polymer having the side chain —O—$CF_2CF_2SO_3H$ (or a salt thereof), the equivalent weight is somewhat lower because of the lower molecular weight of the monomer unit containing a cation exchange group. For an IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, without limitation, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 (hereby incorporated by reference in their entirety) disclose methods for making aqueous alcoholic dispersions. After the dispersion is made, the FSA concentration and the dispersing liquid composition can be adjusted by methods known in the art.

Aqueous dispersions comprising colloid-forming polymeric acids, including FSA polymers, typically have particle sizes as small as possible, so long as a stable colloid is formed. Aqueous dispersions of FSA polymer are available commercially as Nafion® dispersions, from E. I. du Pont de Nemours and Company (Wilmington, Del.). An example of a suitable FSA polymer comprises a copolymer having a structure:

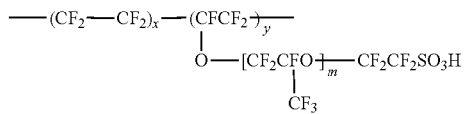

The copolymer comprises tetrafluoroethylene and perfluoro (4-methyl-3,6-dioxa-7-octene-1-sulfonic acid) wherein m=1.

Aqueous dispersions of FSA polymer from US2004/0121210 A1 or US2005/0037265 A1 could be made by using the methods disclosed in U.S. Pat. No. 6,150,426; the disclosure of the previously identified U.S. patents and patent applications is hereby incorporated by reference in their entirety.

Other suitable FSA polymers are disclosed in U.S. Pat. No. 5,422,411; hereby incorporated by reference in its entirety. One such suitable polymeric acid that can be used as counter ion/dispersant for polythienothiophenes can have the following structure:

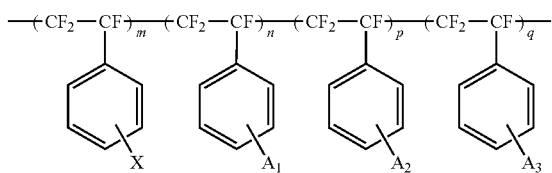

where at least two of m, n, p and q are integers greater than zero; $A_1$, $A_2$, and $A_3$ are selected from the group consisting of alkyls, halogens, $CyF_{2y+1}$ where y is an integer greater than zero, O—R (where R is selected from the group consisting of alkyl, perfluoroalkyl and aryl moieties), $CF=CF_2$, CN, $NO_2$ and OH; and X is selected from the group consisting of $SO_3H$, $PO_2H_2$, $PO_3H_2$, $CH_2PO_3H_2$, COOH, $OPO_3H_2$, $OSO_3H$, $OArSO_3H$ where Ar is an aromatic moiety, $NR_3^+$ (where R is selected from the group consisting of alkyl, perfluoroalkyl and aryl moieties), and $CH_2NR_3^+$ (where R is selected from the group consisting of alkyl, perfluoroalkyl and aryl moieties). The $A_1$, $A_2$, $A_3$ and X substituents may be located in the ortho, meta and/or para positions. The copolymer may also be binary, ternary or quaternary.

In one embodiment, thienothiophene or the thieno[3,4-b]thiophene monomers are oxidatively polymerized in an aqueous medium comprising polymeric acid colloids. Typically, the thienothiophene or thieno[3,4-b]thiophene monomers are combined with or added to an aqueous dispersion comprising at least one polymerization catalyst, at least one oxidizing agent, and colloidal polymeric acid particles. In this embodiment, the order of combination or addition may vary provided that the oxidizer and catalyst is typically not combined with the monomer until one is ready for the polymerization reaction to proceed. Polymerization catalysts include, without limitation, at least one member selected from the group consisting of ferric sulfate, ferric chloride, cerium sulfate, and the like and mixtures thereof. Oxidizing agents include, without limitation, at least one member selected from the group consisting of ferric sulfate, ferric chloride, sodium persulfate, potassium persulfate, ammonium persulfate, and the like, including combinations thereof. In some cases, the oxidant and catalyst can comprise the same compound. The oxidative polymerization results in a stable, aqueous dispersion comprising positively charged conducting polymeric thienothiophene and/or thieno[3,4-b]thiophene that is charge balanced by the negatively charged side chains of the polymeric acids contained within the colloids (e.g., sulfonate anion, carboxylate anion, acetylate anion, phosphonate anion, combinations, and the like). While any suitable process conditions can be employed for polymerizing the thienothiophene, using the temperature ranges from about 8 to about 95° C. as well as conditions and equipment sufficient to obtain, mix and maintain a dispersion are useful.

In one embodiment of the invention, a method of making an aqueous dispersions comprising poly(thieno[3,4-b]thiophene) and at least one colloid-forming polymer acid comprises: (a) providing an aqueous dispersion comprising at least one polymer acid; (b) adding at least one oxidizer to the dispersion of step (a); (c) adding at least one catalyst or oxidizer to the dispersion of step (b); (d) adding thieno[3,4-b]thiophene monomer to the dispersion of step (c), (e) permitting the monomer dispersion to polymerize, and (f) adjusting the pH of the dispersion to a value sufficiently high to render the material resistivity stable. The method may include adjusting the pH to a value greater than about 3. In another embodiment, the pH value may be adjusted to greater than 6 or greater than 8. One alternative embodiment to this method comprises adding thieno[3,4-b]thiophene monomer to the aqueous dispersion of a polymeric acid prior to adding the oxidizer. Another embodiment, comprises forming an aqueous dispersion comprising water and thieno[3,4-b]thiophene (e.g., of any number of thieno[3,4-b]thiophene concentrations in water which is typically in the range of about 0.05% by weight to about 50% by weight thieno[3,4-b]thiophene), and add this thieno[3,4-b]thiophene mixture to the aqueous dispersion of the polymeric acid before or after adding the oxidizer and catalyst. In yet another embodiment, thienothiophene monomer is dissolved in an organic solvent that is compatible with water, and the dissolved monomer solution is added to the aqueous dispersion of polymeric acid before or after adding the oxidizer and/or catalyst.

The compositions of the present invention are not limited to the homopolymeric structures above and may include hetereopolymeric or copolymeric structures. The copolymeric structures may be any combination of alternating copolymers (e.g., alternating A and B units), periodic copolymers (e.g., (A-B-A-B-A-A-A-A-B-B-B)n, random copolymers (e.g., random sequences of monomer A and B), statistical copolymers (e.g., polymer sequence obeying statistical rules) and/or block copolymers (e.g., two or more homopolymer subunits linked by covalent bonds). The copolymers may be branched or linked, provided the resultant copolymer maintains the properties of electrical conductivity. The copolymer structures may be formed from monomeric, oligomeric or polymeric compounds. For example, monomers suitable for use in the copolymer system may include monomers such as thiophene, substituted thiophenes, substituted thieno[3,4-b]thiophenes, dithieno[3,4-b:3',4'-d]thiophene, pyrrole, bithiophene, substituted pyrroles, phenylene, substituted phenylenes, naphthalene, substituted naphthalenes, biphenyl and terphenyl, substituted terphenyl, phenylene vinylene and substituted phenylene vinylene.

In addition to thienothiophene or the thieno[3,4-b]thiophene monomers, other thiophene monomeric compounds may be utilized in the present invention, provided that the resultant polymer is electrically conductive and includes a pH adjusted to a value of about 3 to about 10.

In some cases, the dispersion can include at least one metal (e.g., at least one ion). Examples of metals that can be added or present in the dispersion comprise at least one member selected from the group consisting of $Fe^{2+}$, $Fe^{3+}$, $K^+$, and $Na^+$., mixtures thereof, among others. The oxidizer:monomer molar ratio is usually about 0.05 to about 10, generally in the range of about 0.5 to about 5. (e.g., during the inventive polymerization steps). If desired, the amount of metal can be lowered or removed by exposing the dispersion to cationic and ionic exchange resins.

The thienothiophene monomer polymerization can be carried out in the presence of co-dispersing liquids which are normally miscible with water. Examples of suitable co-dispersing liquids comprise at least one member selected from the group consisting of ethers, alcohols, ethers, cyclic ethers, ketones, nitrites, sulfoxides, and combinations thereof. In one embodiment, the amount of co-dispersing liquid is less than about 30% by volume. In one embodiment, the amount of co-dispersing liquid is less than about 60% by volume. In one embodiment, the amount of co-dispersing liquid is between about 5% to about 50% by volume. In one embodiment, the co-dispersing liquid comprises at least one alcohol. In one embodiment, the co-dispersing liquid comprises at least one member selected from the group of n-propanol, isopropanol, t-butanol, methanol, dimethylacetamide, dimethylformamide, N-methylpyrrolidone. The co-dispersing liquid can comprise an organic acid such as at least one member selected from the group consisting of p-toluenesulfonic acid, dodecylbenzenesulfonic acid, methanesulfonic acid, trifluoromethanesulfonic acid, camphorsulfonic acid, acetic acid, mixtures thereof and the like. Alternatively, the acid can comprise a water soluble polymeric acid such as poly(styrenesulfonic acid), poly(2-acrylamido-2-methyl-1-propanesulfonic acid), or the like, or a second colloid-forming acid, as described above. Combinations of acids can also be used.

The organic acid can be added to the polymerization mixture at any point in the process prior to the addition of either the oxidizer or the thienothiophene monomer, whichever is added last. In one embodiment, the organic acid is added before both the thienothiophene monomer and the colloid-forming polymeric acid, and the oxidizer is added last. In one embodiment the organic acid is added prior to the addition of the thienothiophene monomer, followed by the addition of the colloid-forming polymeric acid, and the oxidizer is added last. In another embodiment, the polymeric co-acid can be added to the aqueous dispersion after the as-synthesized aqueous dispersion has been treated with ion exchange resin(s). The co-dispersing liquid can be added to the polymerization mixture at any point prior to the addition of the oxidizer, catalyst, or monomer, whichever is last.

In another aspect of the invention, after completing any of the methods described above and completion of the polymerization, the as-synthesized aqueous dispersion is contacted with at least one ion exchange resin under conditions suitable to produce a stable, aqueous dispersion. In one embodiment, the as-synthesized aqueous dispersion is contacted with a first ion exchange resin and a second ion exchange resin. In another embodiment, the first ion exchange resin comprises an acidic, cation exchange resin, such as a sulfonic acid cation exchange resin set forth above, and the second ion exchange resin comprises a basic, anion exchange resin, such as a tertiary amine or a quaternary exchange resin.

In still another embodiment of the invention relates methods for producing pH adjusted, resistivity stable aqueous dispersions of polythienothiophene comprising polymerizing thienothiophene monomers in the presence of polymeric sulfonic acid colloids. In one embodiment of the inventive methods, the polythienothiophene comprises a poly(thieno[3,4-b]thiophene) and the colloid-forming polymeric sulfonic acid is fluorinated. In another embodiment of the inventive methods, the polythienothiophene comprise poly(thieno[3,4-b]thiophene) and the colloid-forming polymeric sulfonic acid is perfluorinated. In still another embodiment, the colloid-forming polymeric sulfonic acid comprises perfluoroethylenesulfonic acid. The polymerization is carried out in the presence of water. The resulting mixture can be treated with ion exchange resins to remove byproducts. Subsequent to the polymerization, the pH may be adjusted by addition of basic materials, such as aqueous solutions of NaOH or other suitable bases. In addition, the ion exchange resin utilized may be a basic ion exchange resin that increases the pH of the dispersion.

Ion exchange comprises a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins can be employed in the present invention. In one embodiment, the acidic, cation exchange resin comprises an organic acid, cation exchange resin, such as a sulfonic acid cation exchange resin. Sulfonic acid cation exchange resins contemplated for use in the practice of the invention can comprise at least one member selected from the group consisting of sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin comprises at least one organic acid, cation exchange resin, such as carboxylic acid, acrylic or phosphoric acid cation exchange resin and mixtures thereof. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, tetra-methylammonium hydroxide, calcium hydroxide, cesium hydroxide, and mixtures thereof, among others.

In another embodiment, the basic, anionic exchange resin comprises at least one tertiary amine anion exchange resin. Tertiary amine anion exchange resins contemplated for use in the practice of the invention can comprise at least one member selected from the group consisting of tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin comprises at least one quaternary amine anion exchange resin, or mixtures of these and among other exchange resins.

The first and second ion exchange resins may contact the as-synthesized aqueous dispersion either simultaneously, or consecutively. For example, in one embodiment both resins are added simultaneously to an as-synthesized aqueous dispersion comprising an electrically conducting polymer, and allowed to remain in contact with the dispersion for at least about 1 hour, e.g., about 2 hours to about 20 hours. The ion exchange resins can then be removed from the dispersion by filtration. This procedure can be repeated as desired in order to achieve a given ion concentration. The size of the filter is chosen so that the relatively large ion exchange resin particles will be removed while the smaller dispersion particles will pass through. Without wishing to be bound by theory or explanation, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins increases the pH of the dispersion. Generally, around 1-2 g of ion exchange resin per milli-equivalent oxidant is used to remove the oxidant. In one embodiment, 5-10 g of ion exchange resin is used per 1 g of $Fe_2(SO4)_3 \cdot H_2O$. In general, at least 1 gram of ion exchange resin is used per about 1 gram of colloid-forming polymeric acid. In one embodiment, about one gram of Lewatit® MP62 WS, a weakly basic anion exchange resin from Bayer GmbH, and about one gram of Lewatit® Mono-Plus S100, a strongly acidic, acid cation exchange resin from Bayer, GmbH, are used per gram of the composition of poly(thieno[3,4-b]thiophene) and at least one colloid-forming polymeric acid.

In one embodiment, the aqueous dispersion resulting from polymerizing thieno[3,4-b]thiophene with or while in the presence of fluorinated polymeric sulfonic acid colloids is charged to a reaction vessel first with an aqueous dispersion comprising the fluorinated polymer. The following compounds are added to the dispersion in order: the oxidizer and thieno[3,4-b]thiophene monomer; or, also in order: the thieno[3,4-b]thiophene monomer, and the oxidizer (e.g., in some cases, one material can function as an oxidant as well as a catalyst). The dispersion is mixed and polymerization is then allowed to proceed at a controlled temperature (e.g., mixed in order to maintain a dispersion). When polymerization is completed, the mixture is quenched with a strong acid cation resin and a base anion exchange resin, stirred and filtered. Alternatively, the thieno[3,4-b]thiophene can be added to water and dispersed prior to addition of Nafion® dispersion, followed with catalyst and/or oxidizer. The oxidizer:monomer molar ratio is about 0.05 to about 10, generally in the range of about 0.5 to about 5. The weight ratio of fluorinated polymer to thieno[3,4-b]thiophene monomer is about 1 to about 100, generally in the range of about 5 to about 50. The overall solid content is generally in the range of about 0.1% to about 10%; and in one embodiment about 2% to about 5%. The polymerization temperature is generally in the range of about 8° C. to about 95° C.; and in one embodiment about 15° C. to about 80° C. The polymerization time is generally in the range of about 1 to about 24 hours; and in one embodiment about 4 to about 6 hours.

As synthesized aqueous dispersions comprising polythienothiophenes polymer acid colloids comprising poly(thieno[3,4-b]thiophenes) and fluorinated polymeric sulfonic acid colloids, can have a wide range of pH and can be adjusted to typically between about 3 to about 10, or about 3 to about 6 when adjusted via contact with an ion exchange resin or from about 3 to about 8 or greater than about 8 to about 10. when adjusted by titration. It is frequently desirable to have a higher pH, as the acidity can be corrosive. It has been surprisingly fount that at a higher pH, the resistivity of films cast from the dispersion is changed to a much lesser degree upon annealing. It has been found that the pH can be adjusted using known techniques, for example, ion exchange or by titration with an aqueous basic solution. Aqueous dispersions of polythienothiophenes and other colloid-forming polymeric acids can be similarly treated to adjust the pH. Titration pH adjustment may be accomplished utilizing any known pH adjusting solution, including addition of aqueous basic solutions. The aqueous basic solutions may be organic or inorganic basic materials. Suitable aqueous basic solutions may include, but are not limited to solutions of sodium hydroxide, ammonium hydroxide, tetra-methylammonium hydroxide, calcium hydroxide, cesium hydroxide, and mixtures thereof, among others.

In another embodiment, more conductive dispersions are formed by adding highly conductive additives to the aqueous dispersions of poly(thieno[3,4-b]thiophene) and the colloid-forming polymeric acid. Because dispersions with relatively high pH can be formed, the conductive additives, especially metal additives, are less susceptible to attack by the acid in the dispersion. Moreover, because the polymeric acids are colloidal in nature, having the surfaces predominately containing acid groups, electrically conducting polythienothiophene can be formed on the colloidal surfaces. Because of this unique structure, a relatively low weight percentage of highly conductive additives, can be used, as desired, to reach the percolation threshold. Examples of suitable conductive additives can comprise at least one member selected from the group consisting of metal particles and nanoparticles, nanowires, carbon nanotubes, graphite fiber or particles, carbon particles and combinations thereof.

In another embodiment of the invention, there are provided hole injection layers aqueous dispersions comprising polythienothiophenes and colloid-forming polymeric acids, comprising as one embodiment poly(thieno[3,4-b]thiophene) and colloid-forming polymeric acids. In one embodiment, the hole injection layers are cast from aqueous dispersions comprising colloid-forming polymeric sulfonic acid (e.g., cast by spin coating, ink-jet printing, among other methods). In one embodiment, the hole injection layer is cast from an aqueous dispersion comprising poly(thieno[3,4-b]thiophene) and fluorinated polymeric acid colloids. In another embodiment, the fluorinated polymeric acid colloids are fluorinated polymeric sulfonic acid colloids. In still another embodiment, the hole injection layer is cast from an aqueous dispersion comprising poly(thieno[3,4-b]thiophene) and perfluoroethylenesulfonic acid colloids.

In one embodiment of the invention, the cast thin film or layer of the hole injection layer is annealed typically at elevated temperatures (e.g., up to about 250° C.). By "annealing" it is meant that the film is treated under conditions necessary to impart desired properties for targeted applications, such as removal of residual solvent or moistures. Without wishing to be bound by any theory or explanation, annealing at elevated temperatures can increase the conductivity of the cast hole injection layer. MALDI-TOF mass spectroscopy measurements confirm that the number of repeat units in the conductive polymer chains increases after annealing. These improved properties of the annealed films result in improved device performance, such as higher brightness at the same voltage, and longer device lifetime. While any suitable annealing atmosphere can be employed, examples of suitable atmospheres include, but are not limited to oxygen, nitrogen, among others.

Matrix assisted laser desorption/ionization (MALDI) time-of-flight (TOF) mass spectroscopy is used to determine the molecular weight of polythienothiophene chains in the conductive polymers synthesized in this invention. Films drop cast from the conductive polymer dispersions have been analyzed using MALDI mass spectroscopy. It has been found that after the films are treated at higher temperature (e.g., about 180 to 250° C.), the number of the repeat units in the polythienothiophene chains increases. The results indicate that when the conductive polymer films are annealed at elevated temperatures, further polymerization occurs in the solid state, which increases the chain length of the conductive polymers. Further polymerization during annealing in the solid state is reduced or eliminated in films cast from dispersions having a raised pH value. Therefore, the resistivity of the film, once in the solid state, remains substantially constant.

In another embodiment, hole injection layers are cast from aqueous dispersions comprising polythienothiophene, comprising polymeric thieno[3,4-b]thiophene, and colloid-forming polymeric acids blended with additional water soluble or dispersible materials. Depending on the final application of the material, examples of additional water soluble or dispersible materials which can be added include, but are not limited to polymers, dyes, coating aids, carbon nanotubes, nanowires, surfactants (e.g., fluorosurfactants such as Zonyl® FSO series non-ionic fluorosurfactants (e.g., available commercially from DuPont, Wilmington, Del.) with structure $R_fCH_2CH_2$—O—$(CH_2CH_2O)_xH$, where $R_f=F(CF_2CF_2)_y$, x=0 to about 15 and y=1 to about 7, acetylenic diol based surfactants such as Dynol™ and Surfynol® series (e.g., available commercially from Air Products and Chemicals, Inc., Allentown, Pa.), organic and inorganic conductive inks and pastes, charge transport materials, crosslinking agents, and combinations thereof. The materials can be simple molecules or polymers. Examples of suitable other water soluble or dispersible polymers comprise at least one conductive polymer such as polythiophenes, polyanilines, polyamines, polypyrroles, polyacetylenes, and combinations thereof.

In another embodiment, the invention relates to electronic devices comprising at least one electroactive layer (usually a semiconductor conjugated small molecule or polymer) positioned between two electrical contact layers, wherein at least one of the layers of the device includes the inventive hole injection layer. One embodiment of the present invention is illustrated by an OLED device, as shown in FIG. 1. Referring now to FIG. 1, FIG. 1 illustrates a device that comprises an anode layer 110, a hole injection layer 120, an electroluminescent layer 130, and a cathode layer 150. Adjacent to the cathode layer 150 is an optional electron-injection/transport layer 140. Between the hole injection layer 120 and the cathode layer 150 (or optional electron injection/transport layer 140) is the electroluminescent layer 130. Alternatively, a layer of hole transport and/or electron blocking layer, commonly termed interlayer, can be inserted between the hole injection layer 120 and the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support (e.g., a flexible organic film comprising poly(ethylene terephthalate), poly(ethylene naphthalene-2,6-dicarboxylate), and polysulfone). The anode layer 110 comprises an electrode that is more efficient for injecting holes compared to the cathode layer 150. The anode can comprise materials containing a metal, mixed metal, alloy, metal oxide or mixed oxide. Suitable materials comprise at last one member selected from the group consisting of mixed oxides of the Group 2 elements (e.g., Be, Mg, Ca, Sr, Ba, Ra), the Group 11 elements, the elements in Groups 4, 5, and 6, and the Group 8-10 transition elements (The IUPAC number system is used throughout, where the groups from the Periodic Table are numbered from left to right as 1-18 [CRC Handbook of Chemistry and Physics, $81^{st}$ Edition, 2000]). If the anode layer 110 is light transmitting, then mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, comprise at least one member selected from the group consisting of indium-tin-oxide ("ITO"), aluminum-tin-oxide, doped zinc oxide, gold, silver, copper, and nickel. The anode may also comprise a conductive organic material such as polyaniline, polythiophene or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include RF magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

Hole injection layer 120 includes polythienothiophene or other suitable polythiophene having a pH adjusted to a value of between about 3 and about 10 according to an embodiment of the present invention. The hole injection layer 120 is usually cast onto substrates using a variety of techniques well-known to those skilled in the art. Typical casting techniques include, for example, solution casting, drop casting, curtain casting, spin-coating, screen printing, inkjet printing, gravure printing, spray coating, among others When the hole injection layer is applied by spin coating, the viscosity and solid contents of the dispersion, and the spin rate can be employed to adjust the resultant film thickness. Films applied by spin coating are generally continuous and without pattern. Alternatively, the hole injection layer can be patterned using a number of depositing processes, such as ink jet printing such as described in U.S. Pat. No. 6,087,196; hereby incorporated by reference in its entirety.

The electroluminescent (EL) layer 130 may typically be a conjugated polymer, such as poly(paraphenylenevinylene), abbreviated as PPV, polyfluorene, spiropolyfluorene or other EL polymer material. The EL layer can also comprise relatively small molecules fluorescent or phosphorescent dye such as 8-hydroxquinoline aluminum ($Alq_3$) and tris(2-(4-tolyl)phenylpyridine) Iridium (III), a dendrimer, a blend that contains the above-mentioned materials, and combinations. The EL layer can also comprise inorganic quantum dots or blends of semiconducting organic material with inorganic quantum dots. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. That is, layer 140 may promote electron mobility and reduce the likelihood of a quenching reaction that can occur when layers 130 and 150 are in direct contact. Examples of materials for optional layer 140 comprise at least one member selected from the group consisting of metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, CaO, LiF, CsF, NaCl, $Li_2O$, mixtures thereof, among others.

The cathode layer 150 comprises an electrode that is particularly efficient for injecting electrons or negative charge carriers. The cathode layer 150 can comprise any suitable metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 comprise at least one member selected from the group consisting of calcium, barium, lithium, cerium, cesium, europium, rubidium, yttrium, magnesium, samarium, and alloys and combinations thereof. When a reactive low work function metal such as Ca, Ba or Li is used, an overcoat of a more inert metal, such as silver or aluminum, can be used to protect the reactive metal and lower the cathode resistance.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view). For top emitting devices, a very thin layer of low work function metal such as Ca and Ba combined with a thicker layer transparent conductor such as ITO can be used as transparent cathode. Top emitting devices are beneficial in active matrix display because larger aperture ratio can be realized. Examples of such devices are described in "Integration of Organic LED's and Amorphous Si TFT's onto Flexible and Lightweight Metal Foil Substrates"; by C. C. Wu et al; IEEE Electron Device Letters, Vol. 18, No. 12, December 1997, hereby incorporated by reference in its entirety.

In other embodiments, additional layer(s) may be present within organic electronic devices. For example, a layer (not shown) between the hole injection layer 120 and the EL layer 130 may facilitate positive charge transport, energy-level matching of the layers, function as a protective layer, among other functions. Similarly, additional layers (not shown) between the EL layer 130 and the cathode layer 150 may facilitate negative charge transport, energy-level matching between the layers, function as a protective layer, among other functions. Layers that are known in the art can be also be included. In addition, any of the above-described layers can be made of two or more layers. Alternatively, some or all of inorganic anode layer 110, the hole injection layer 120, the EL layer 130, and cathode layer 150, may be surface treated to increase charge carrier transport efficiency. The choice of materials for each of the component layers may be determined by balancing the goals of providing a device with high device efficiency and longer device lifetime with the cost of manufacturing, manufacturing complexities, or potentially other factors.

The different layers may have any suitable thickness. Inorganic anode layer 110 is usually no greater than approximately 500 nm, for example, approximately 10-200 nm; hole injection layer 120, is usually no greater than approximately 300 nm, for example, approximately 30-200 nm; EL layer 130, is usually no greater than approximately 1000 nm, for example, approximately 30-500 nm; optional layer 140 is usually no greater than approximately 100 nm, for example, approximately 20-80 nm; and cathode layer 150 is usually no greater than approximately 300 nm, for example, approximately 1-150 nm. If the anode layer 110 or the cathode layer 150 needs to transmit at least some light, the thickness of such layer may not exceed approximately 150 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or photovoltaic cells). The light-emitting materials may be dispersed in a matrix of another material, with or without additives, and may form a layer alone. The EL layer 130 generally has a thickness in the range of approximately 30-500 nm.

Examples of other organic electronic devices that may benefit from having one or more layers comprising the aqueous dispersion comprising polythienothiophene made with polymeric acid colloids comprise: (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

Organic light emitting diodes (OLEDs) inject electrons and holes from the cathode 150 and anode 110 layers, respectively, into the EL layer 130, and form negative and positively charged polarons in the polymer. These polarons migrate under the influence of the applied electric field, forming an exciton with an oppositely charged polarons and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s), not shown, may be electrically connected to the electronic device as part of a circuit.

OLEDs provided with hole injection layers may be cast from pH adjusted aqueous dispersions comprising polymeric thieno[3,4-b]thiophenes and colloid-forming polymeric acids have been found to have improved lifetimes, with much slower brightness decrease and voltage increase. The hole injection layer may be cast from a pH adjusted aqueous dispersion obtained by treating dispersions comprising poly (thieno[3,4-b]thiophene) and fluorinated polymeric sulfonic acid colloids with cation exchange resin or basic solution; and in one embodiment comprises an aqueous dispersion in which the pH could be adjusted to above about 3.5 (e.g., by adding a basic compound such as sodium hydroxide or cesium hydroxide).

The present invention permits using a less acidic or pH neutral material that can be annealed at elevated temperature, while reproducibly and reliably permitting the use of a larger variety of compounds with greater control of resultant properties, such as resistivity. The present invention also permits using a less acidic or pH neutral material which can lead to significantly less etching of the ITO layer during device fabrication and in turn reduce the concentration of In and Sn ions diffusing into the polymer layers of the OLED. Without wishing to be bound by any theory or explanation, it is believed that In and Sn ions can contribute to reduced operating lifetime. The lower acidity also reduces corrosion of the metal components of the display (e.g. electrical contact pads) during fabrication and over the long-term storage.

Equipment used to dispense the acidic PEDOT/PSSA needs to be specially designed to handle the relatively strong acidity of PEDOT/PSSA. For example, a chrome-plated slot-die coating-head used to coat the PEDOT/PSSA onto ITO substrates was found to be corroding due to the acidity of the PEDOT/PSSA. This rendered the head unusable since the coated film became contaminated with particles of chrome. PEDOT/PSSA systems also adversely affect certain ink-jet print heads that can be used for fabricating OLED displays. They are used for dispensing both the hole injection layer and the light-emitting polymer layer in precise locations on the display. These print-heads contain nickel mesh filters as an internal trap for particles in the ink. The nickel filters are decomposed by the acidic PEDOT/PSSA and rendered unusable. These corrosion problems can be reduced, if not eliminated by using the aqueous poly(thieno[3,4-b]thiophene) dispersions having pH adjusted according to an embodiment of the invention.

Furthermore, certain light-emitting polymers are found to be sensitive to acidic conditions, and their light-emitting capability is degraded if they are in contact with an acidic hole injection layer. It is advantageous to use the inventive aqueous poly(thieno[3,4-b]thiophene) dispersions to form the hole injection layer because of the lower acidity or neutrality.

The fabrication of full-color or area-color displays using two or more different light-emitting materials becomes complicated if each light-emitting material requires a different cathode material to optimize its performance. Display devices typically comprise a multiplicity of pixels which emit light. In multicolor devices, at least two different types of pixels (sometimes referred to as sub-pixels) are emitting light of different colors. The sub-pixels are constructed with different light-emitting materials. It is desirable to have a single cathode material that gives good device performance with all of the light emitters. This minimizes the complexity of the device fabrication. It has been found that a common cathode can be used in multicolor devices where the hole injection layer is made from the inventive aqueous poly(thieno[3,4-b] thiophene). The cathode can be made from any of the materials discussed above; and may be barium, overcoated with a more inert metal such as silver or aluminum.

Other organic electronic devices that may benefit from having one or more layers comprising an aqueous dispersion of polythienothiophene, including poly(thieno[3,4-b] thiophene), and at least one colloid-forming polymeric acids include: (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

If desired, the hole injection layer can be overcoated with a layer of conductive polymer applied from aqueous solution or solvent. The conductive polymer can facilitate charge transfer and also improve coatability. Examples of suitable conductive polymers comprise at least one member selected from the group consisting of polyanilines, polythiophenes, polypyrroles, polyacetylenes, polythienothiophene/polystyrenesulfonic acid, polydioxythiophene/polystyrenesulfonic acid, polyaniline-polymeric-acid-colloids, PEDOT-polymeric-acid-colloids and combinations thereof.

In yet another embodiment, the invention relates to thin film field effect transistors comprising electrodes comprising poly(thieno[3,4-b]thiophenes) and colloid-forming polymeric sulfonic acids. For use as electrodes in thin film field effect transistors, the conducting polymers and the liquids for dispersing or dissolving the conducting polymers are compatible with the semiconducting polymers and the solvents (e.g., to prevent re-dissolution of the polymers or semiconducting polymers). Thin film field effect transistor electrodes fabricated from conducting polymers should have a conductivity greater than about 10 S/cm. However, electrically conducting polymers made with water soluble polymeric acids usually provide conductivity in the range of about $10^{-3}$ S/cm or lower. Thus, in one embodiment of the invention, the electrodes comprise poly(thieno[3,4-b]thiophene) and fluorinated colloid-forming polymeric sulfonic acids in combination with electrical conductivity enhancers such as nanowires, carbon nanotubes, among others. In still another embodiment of the invention, the electrodes comprise poly (thieno[3,4-b]thiophene) and colloid-forming perfluoroethylenesulfonic acid in combination with electrical conductivity enhancers such as nanowires, carbon nanotubes, among others. Inventive compositions may be used in thin film field effect transistors as gate electrodes, drain electrodes, or source electrodes.

In organic thin film transistor (OTFT) devices, charge injection from source electrode to the channel material can be limited due to the mismatch of the work function of the electrode and the energy level of the channel material, which results in a significant voltage drop at the contact between the electrode and the channel material. As a result, apparent charge mobility becomes low, and the OTFT device can only pass low current. Similar to the application as hole injection layer in OLED, a thin layer of the inventive conductive polymer film can be applied between the source or drain electrode and the channel material of an OTFT device, to improve the energy level match, reduce the contact voltage drop and improve charge injection. As a result, higher current and higher charge mobility can be achieved in the OTFT device.

The invention will now be described in greater detail by reference to the following non-limiting examples. The following examples described certain embodiments of the present invention and shall not limit the scope of the claims appended hereto.

Example 1

A dispersion was made according to the procedure described in Dispersion E in our pending application (application Ser. No. 11/240,573), with Nafion® to thieno[3,4-b] thiopehene (TT) ratio of 15:1. The dispersion is hereafter referred to as Dispersion 1. A stock solution of NaOH in electronic-grade water was prepared by dissolving 4.0 g of NaOH into 100 mL of electronic-grade milliQ water. The stock solution of NaOH in water is hereafter referred to as Solution 1. 30 g of the Dispersion 1 was weighed into a plastic bottle. A small amount of NaOH solution from Solution 1 was slowly added to the 30 g of Dispersion 1 while the dispersion was being agitated with a magnetic stirrer. An AccuMet 61 pH probe was used to measure the pH during the titration process. When measuring pH, the stirring of the dispersion was stopped temporarily. The pH value of one dispersion sample was adjusted to 4.1. Similarly, two more dispersion samples were adjusted to 6.0, and 8.1 respectively by adding appropriate amount of Solution 1 into 30 g of Dispersion 1. The pH adjusted dispersions and the control Dispersion 1 were then filtered with 0.45 micron hydrophilic PVDF filters and spin coated, at a spin rate of 1000 rpm for 1 min, onto ITO interdigitated substrates for resistivity measurement. Before spin coating, the ITO substrates were cleaned with ultrasonication in iso-propanol and finally treated with oxygen plasma for 10 min in an SPI Prep II desktop plasma etcher. The spin coated films were then transferred into an argon filled glove box and measured for resistivity using a Keithley 2400 SourceMeter. Then the films were taken out and annealed on a hotplate at 180° C. for 15 min in air. The films were then transferred back into the argon filled glove box and measured for resistivity again. Table 1 summarized the resistivity results. As can be seen, the resistivity changes were much smaller after the pH adjustment. The higher the pH, the smaller the resistivity change after annealing.

TABLE 1

Resistivity of 15:1 dispersions with different pH values.

| pH of dispersion | Resistivity (ohm · cm) measured in Argon glovebox | | ratio (Unannealed/annealed) |
|---|---|---|---|
| | unannealed | Annealed at 180° C., 15 min, in air | |
| Non-pH Adjusted (~2.2) | 4.44E+04 | 1.34E+02 | 332 |
| 4.1 | 4.71E+04 | 6.95E+02 | 68 |
| 6.0 | 1.05E+05 | 1.55E+04 | 7 |
| 8.1 | 1.29E+05 | 4.23E+04 | 3 |

Example 2

A dispersion with Nafion® to TT ratio of 12:1 was made similarly as Dispersion 1. The dispersion is hereafter referred to as Dispersion 2. 50 g of the Dispersion 2 was weighed into a plastic bottle. A small amount of NaOH solution from Solution 1 was slowly added to the 50 g of Dispersion 2 while the dispersion was being agitated with a magnetic stirrer. An AccuMet 61 pH probe was used to measure the pH during the titration process. When measuring pH, the stirring of the dispersion was stopped temporarily. The pH value of one dispersion sample was adjusted to 4.2. Similarly, two more dispersion samples were adjusted to 6.2, and 8.0 respectively by adding appropriate amount of Solution 1 into 50 g of Dispersion 2. The pH adjusted dispersions and the control Dispersion 2 were then filtered with 0.45 micron hydrophilic PVDF filters and spin coated, at a spin rate of 1000 rpm for 1 min, onto ITO interdigitated substrates for resistivity measurement. Before spin coating, the ITO substrates were cleaned with ultrasonication in iso-propanol and finally treated with oxygen plasma for 10 min in an SPI Prep II desktop plasma etcher. The spin coated films were then transferred into an argon filled glove box and measured for resistivity using a Keithley 2400 SourceMeter. Then the films were annealed on a hotplate at 180° C. for 15 min in the argon filled glovebox. The films were then measured for resistivity again. Table 2 summarized the resistivity results. As can be seen, the resistivity changes were much smaller after the pH adjustment. The higher the pH, the smaller the resistivity change after annealing.

TABLE 2

Resistivity of 12:1 dispersions with different pH values.

| pH of dispersion | Resistivity (ohm · cm) measured in argon glovebox | | ratio (Unannealed/annealed) |
|---|---|---|---|
| | Unannealed | Annealed at 180° C., 15 min, Ar | |
| Non-pH Adjusted (~2.2) | 4.87E+03 | 1.21E+01 | 402 |
| 4.2 | 9.81E+03 | 1.72E+03 | 6 |
| 6.2 | 9.41E+03 | 1.85E+03 | 5 |
| 8.0 | 6.65E+03 | 1.85E+03 | 4 |

Example 3

A dispersion with Nafion® to TT ratio of 18:1 was made similarly as Dispersion 1. The dispersion is hereafter referred to as Dispersion 3. 75 g of the Dispersion 3 was weighed into a plastic bottle. A small amount of NaOH solution from Solution 1 was slowly added to the 75 g of Dispersion 3 while the dispersion was being agitated with a magnetic stirrer. An AccuMet 61 pH probe was used to measure the pH during the titration process. When measuring pH, the stirring of the dispersion was stopped temporarily. The pH value of one dispersion sample was adjusted to 4.3. Similarly, two more dispersion samples were adjusted to 6.1, and 8.0 respectively by adding appropriate amount of Solution 1 into 75 g of Dispersion 3. The pH adjusted dispersions and the control Dispersion 3 were then filtered with 0.45 micron hydrophilic PVDF filters and spin coated, at a spin rate of 1000 rpm for 1 min, onto ITO interdigitated substrates for resistivity measurement. Before spin coating, the ITO substrates were cleaned with ultrasonication in iso-propanol and finally treated with oxygen plasma for 10 min in an SPI Prep II desktop plasma etcher. The spin coated films were then transferred into an argon filled glove box and measured for resistivity using a Keithley 2400 SourceMeter. Then the films were annealed on a hotplate at 130° C. for 15 min in the argon filled glovebox. The films were then measured again for resistivity. Table 3 summarized the resistivity results. As can be seen, the resistivity changes were much smaller after the pH adjustment. The higher the pH, the smaller the resistivity change after annealing.

TABLE 3

Resistivity of 18:1 dispersions with different pH values.

| pH of dispersion | Resistivity (ohm · cm) measured in argon glovebox | | ratio (unannealed/annealed) |
|---|---|---|---|
| | unannealed | 130° C., 15 min, Ar | |
| Non-pH Adjusted (~2.2) | 2.86E+05 | 2.23E+04 | 12.8 |
| 4.3 | 1.56E+06 | 6.41E+05 | 2.4 |
| 6.1 | 1.54E+06 | 7.59E+05 | 2.0 |
| 8.0 | 1.41E+06 | 8.92E+05 | 1.6 |

Example 4

Figure 2:
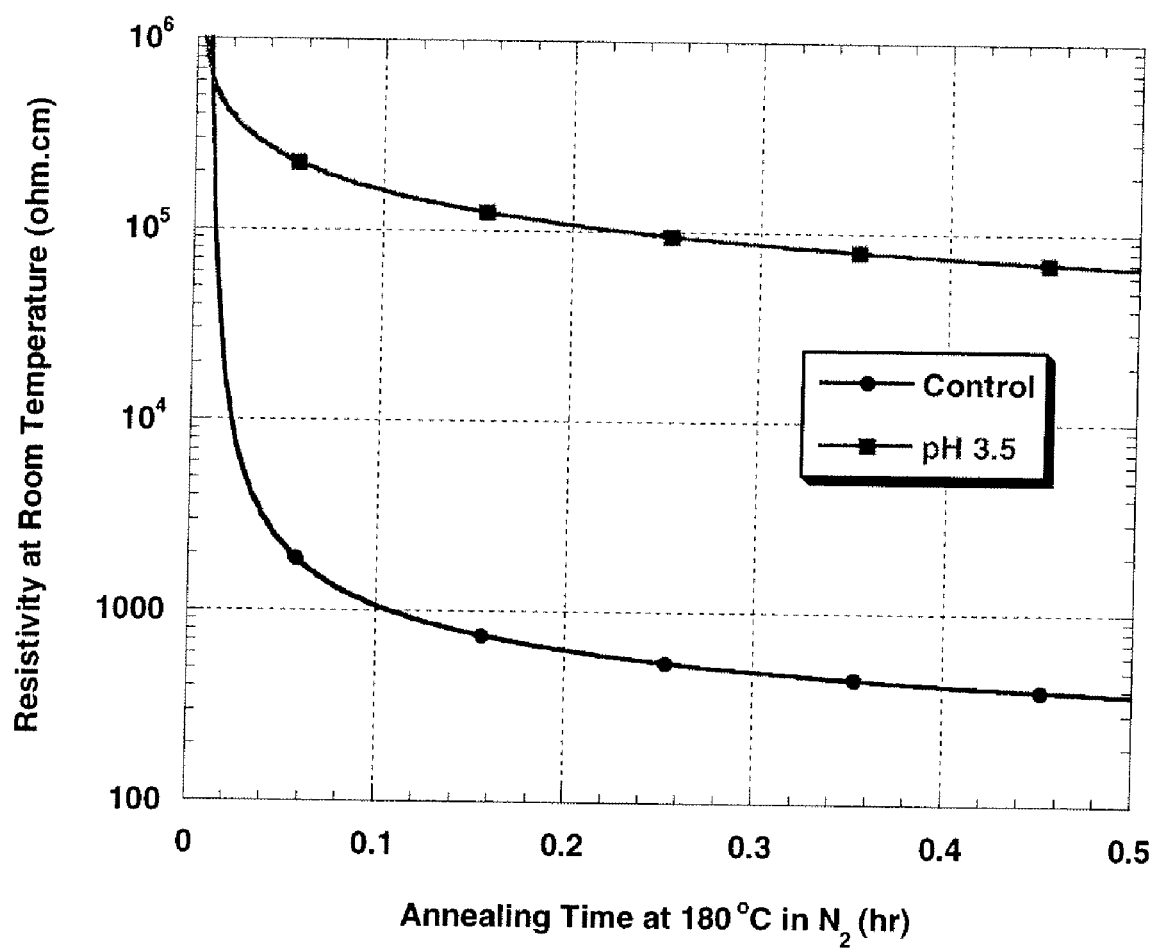
FIG. 2 illustrates the resistivity change as a function of annealing time at 180° C. in $N_2$ atmosphere for films cast from a control dispersion whose pH was not modified, and a dispersion whose pH was raised to 3.5.

A dispersion with Nafion®-to-TT ratio of 18:1 was made using the same procedure as in Example 3. The dispersion is hereafter referred to as Dispersion 4. 50 g of Dispersion 4 was adjusted to pH of 3.5 following the method described in Example 1. Then, a non-pH adjusted Dispersion 4 (control) sample and the pH 3.5 dispersion sample were spin coated onto interdigitated ITO substrates as described in Example 1. For each of the dispersions, three samples were prepared on the interdigitated ITO substrates. The samples were then transferred in a nitrogen filled glove box for in-situ resistivity measurement at 180° C. on a hotplate, one sample at a time. For in-situ resistivity measurement, the sample was put on the hotplate that had been heated and stabilized at 180° C. The current at 1 V was measured continuously at 5 second interval for 30 min, using a Keithley 2400 SourceMeter through a pair of probes connected to the contact pads on the ITO substrate. When the in-situ measurement was done, the sample was then immediately cooled to room temperature by moving the sample from the hotplate to a chunk of stainless steel that was at room temperature. After the sample was cooled to room temperature, the resistivity of the sample was measured again. The in-situ resistivity at room temperature was then calculated from the final resistivity at room temperature and the current measured in-situ, by normalizing the final data point measured in-situ to the final resistivity measured at room temperature. FIG. 2 shows the results of the control and the pH 3.5 dispersions. After pH adjustment, the resistivity change is much smaller/slower.

Example 5

A dispersion with Nafion®-to-TT ratio of 18:1 was made using the same procedure as in Example 3. The dispersion is hereafter referred to as Dispersion 5.

Preparation of Cleaned Amberlite® IR120-Na

A 500 mL polybottle was charged with 202 g of ion exchange resin, Amberlite® IR120 in the sodium form, and 300 mL of electronic grade water. Amberlite® is a federally registered trademark of Rohm & Haas Company, Philadelphia, Pa. for ion exchange resin. The material charge was allowed to soak without stirring at 20-24° C., for between one and four hours, after which the resin was collected on a 60 mesh stainless steel screen. This washing step was repeated for a total of five times at room temperature, followed by three more washes using same quantity of materials except the mixture was heated at 70° C. for 2 hours. The resin was finally collected on a 60 mesh screen to produce cleaned IR120-Na with 55.2% solids Preparation of Cleaned Amberlite® IR120-NH$_4$ A 500 mL polybottle was charged with 100 g of ion exchange resin, Amberlite® IR120 in the hydrogen form, 300 mL of electronic grade water, and 100 mL of concentrated (28-30%) ammonium hydroxide. The material charge was mixed for 16 hours on a jar roller at 20-24° C., after which the resin was collected on a 60 mesh stainless steel screen. The resin was then washed by soaking in 300 mL of electronic grade water without stirring for between one and four hours. This washing step was repeated for a total of five times at room temperature, followed by three more washes using same quantity of materials except the mixture was heated at 70° C. for 2 hours. The resin was finally collected on a 60 mesh screen to produce cleaned IR120-NH$_4$ with 56.9%% solids pH Adjustment Using IR120-Na A 500 mL polybottle was charged with 300 g of Dispersion 5 and 30 g of cleaned IR120-Na. The bottle was rolled at 25 rpm for 5 hours after which the resin was removed by filtration through a 60 mesh stainless steel screen. The pH adjusted dispersion is hereafter referred to as Dispersion 5A. pH of the dispersion is 3.3. Na level in the dispersion was measured to be 390 ppm by inductively coupled plasma metal analysis.

pH Adjustment Using IR120NH$_4$

A 500 mL polybottle was charged with 300 g of Dispersion 5 and 30 g of cleaned IR120-NH$_4$. The bottle was rolled at 25 rpm for 5 hours after which the resin was removed by filtration through a 60 mesh stainless steel screen. The pH adjusted dispersion is hereafter referred to as Dispersion 5B and the pH of the dispersion is 3.3.

Films were spin coated from Dispersion 5A and 5B and measured for resistivity, following the same procedures as in Example 3, except the annealing condition was 170° C., 10 min. Table 4 summarizes the resistivity results.

TABLE 4

Resistivity of Dispersions 5A and 5B.

| | | Resistivity (Ohm · cm) measured in glovebox | | |
|---|---|---|---|---|
| Dispersion | pH | unannealed | Annealed at 170° C., 10 min, N2 | Ratio (unannealed/annealed) |
| Dispersion 5A | 3.3 | 4.9E+05 | 6.8E+04 | 7.2 |
| Dispersion 5B | 3.3 | 4.7E+05 | 1.2E+04 | 39.2 |

The invention claimed is:

1. A method comprising:
   (a) providing an aqueous solution comprising at least one oxidant and/or at least one catalyst;
   (b) providing an aqueous dispersion comprising a colloid-forming polymeric acid;
   (c) combining the aqueous solution of the oxidant and/or catalyst with the aqueous dispersion of the colloid-forming polymeric acid,
   (d) adding thienothiophene monomer to the combined aqueous dispersion of step (c);
   (e) polymerizing the thienothiophene monomer containing dispersion to form a polymeric dispersion;
   (f) adjusting the pH of the polymer dispersion to a pH from about 3 to about 8;
   (g) forming a film from the dispersion; and,
   (h) annealing the film under an inert atmosphere wherein the film has a resistivity change ratio of less than 100:1 before and after annealing.

2. The method of claim 1, further comprising contacting the dispersion with an ion exchange resin.

3. The method of claim 1, wherein the at least one oxidant comprises at least one member selected from the group consisting of ferric sulfate, ferric chloride, sodium persulfate, potassium persulfate and ammonium persulfate.

4. The method of claim 1, wherein the at least one catalyst comprises at least one member selected from the group consisting of ferric sulfate, ferric chloride and cerium sulfate.

5. The method of claim 1, wherein the step of adjusting the pH includes contacting the dispersion with a basic ion exchange resin.

6. The method of claim 1, wherein the step of adjusting the pH includes titrating the dispersion with at least one basic material.

7. The method of claim 6, wherein the basic material comprises at least one member selected from the group consisting of sodium hydroxide, ammonium hydroxide, tetra-methylammonium hydroxide, calcium hydroxide, cesium hydroxide, and combinations thereof.

8. The method of claim 1, wherein the resistivity change ratio of a film cast from the polymer dispersion is less than about 10:1 before and after annealing.

9. The method of claim 1 wherein the annealed film has an electrically conductive polythienothiopene layer having a resitivity of from about $10^{-2}$ to about $10^{-7}$ ohm-cm and having resistivity stability.

10. The method of claim 8 wherein the inert atmosphere comprises argon.

11. The method of claim 8 wherein the inert atmosphere comprises nitrogen.

* * * * *